United States Patent
Hwang (10) Patent No.: US 7,504,300 B2
(45) Date of Patent: Mar. 17, 2009

(54) METHOD FOR FABRICATING SEMICONDUCTOR MEMORY DEVICE HAVING CYLINDER TYPE STORAGE NODE

(75) Inventor: Eui-Seong Hwang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 410 days.

(21) Appl. No.: 11/149,175

(22) Filed: Jun. 10, 2005

(65) Prior Publication Data

US 2006/0024883 A1 Feb. 2, 2006

(30) Foreign Application Priority Data

Jul. 30, 2004 (KR) .................. 10-2004-0060276

(51) Int. Cl.
*H01L 21/8239* (2006.01)

(52) U.S. Cl. ............... 438/254; 438/397; 257/E21.014

(58) Field of Classification Search ........... 257/E21.014
See application file for complete search history.

(56) References Cited

U.S. PATENT DOCUMENTS

| | | | | |
|---|---|---|---|---|
| 6,090,679 | A * | 7/2000 | Lou ............................ | 438/396 |
| 6,380,579 | B1 * | 4/2002 | Nam et al. ................... | 257/306 |
| 6,423,608 | B1 * | 7/2002 | Kim ............................ | 438/396 |
| 6,573,552 | B1 * | 6/2003 | Thakur ....................... | 257/309 |
| 2002/0190294 | A1 * | 12/2002 | Iizuka et al. ................ | 257/296 |
| 2005/0287737 | A1 * | 12/2005 | Park et al. .................... | 438/239 |
| 2006/0024883 | A1 | 2/2006 | Hwang | |

FOREIGN PATENT DOCUMENTS

| | | |
|---|---|---|
| JP | 2003-045999 | 2/2003 |
| KR | 10-2000-65969 | 11/2000 |
| KR | 10-2003-0053203 | 6/2003 |

OTHER PUBLICATIONS

Notice of Preliminary Rejection from the Korean Intellectual Property Office, dated Nov. 13, 2006, in counterpart Korean Patent Application No. 2004-0060276.

* cited by examiner

*Primary Examiner*—Stephen W Smoot
(74) *Attorney, Agent, or Firm*—Finnegan, Henderson, Farabow, Garrett & Dunner, L.L.P.

(57) ABSTRACT

Disclosed is a method for fabricating a semiconductor memory device capable of preventing a bunker defect caused by a pinhole or a crack on a single metal layer used as a storage node. The method includes the steps of: forming a plurality of storage node plugs on a substrate; forming an insulation layer with a plurality of openings exposing surfaces of the plurality of storage node plugs on the substrate; forming a plurality of cylinder-type storage nodes inside of the plurality of opening in a structure that a different kind of conductive layer is formed between the same kinds of conductive layers; selectively removing the insulation layer; forming a dielectric layer on the plurality of cylinder type storage nodes; and forming a plate electrode on the dielectric layer.

18 Claims, 6 Drawing Sheets

METHOD FOR FABRICATING SEMICONDUCTOR MEMORY DEVICE HAVING CYLINDER TYPE STORAGE NODE

FIELD OF THE INVENTION

The present invention relates to a technology of fabricating a semiconductor device; and more particularly, to a method for fabricating a semiconductor memory device including capacitors.

DESCRIPTION OF RELATED ARTS

As the minimum linewidth and a degree of integration of semiconductor devices have been increased, an area in which capacitors are formed has been decreased. Accordingly, although the capacitor area has been decreased, the individual capacitor in a cell region should ensure capacitance greater than 25 pF which is the least required amount per cell. Thus, there have been suggested various methods to form a capacitor that has high capacitance within a limited area. One suggested method is to form a dielectric layer with high electric permittivity such as $Ta_2O_5$, $Al_2O_3$ or $HfO_2$, replacing a silicon dioxide layer having a dielectric constant ($\in$) of 3.8 and a nitride layer having a dielectric constant ($\in$) of 7. Another suggested method is to effectively increase an area of a bottom electrode by forming the bottom electrode with a three-dimensional structure such as a cylinder type or a concave type, or by increasing an effective surface area of a bottom electrode by 1.7-fold to two fold through growing metastable polysilicon (MPS) grains on the surface of the bottom electrode. Another suggested method is to form a capacitor by forming a bottom electrode and an upper electrode with a metal layer.

Figure 1A:
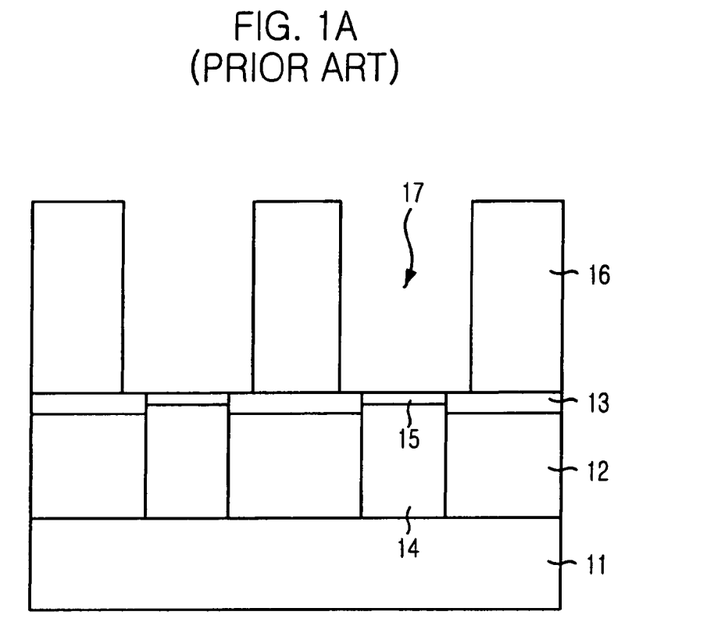
FIGS. 1A to 1C are cross-sectional views illustrating a conventional method for fabricating a semiconductor memory device including a plurality of cylinder-type storage nodes.
Figure 1B:
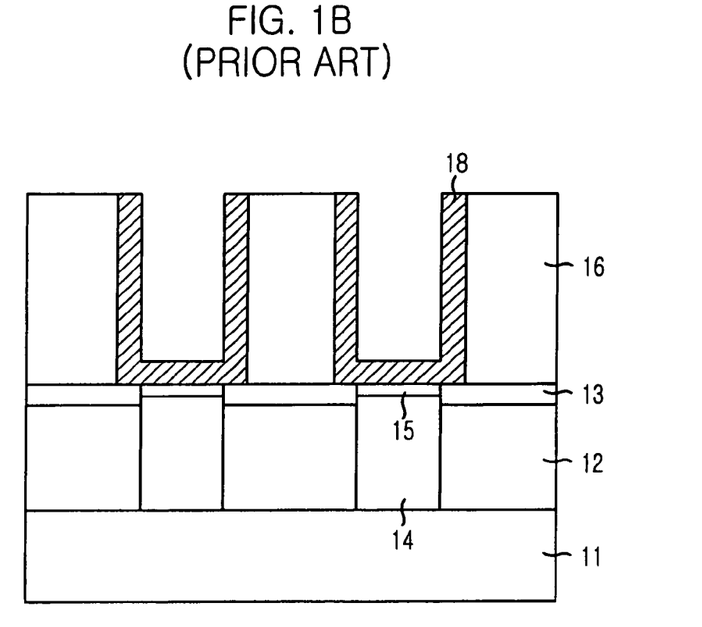
Figure 1C:
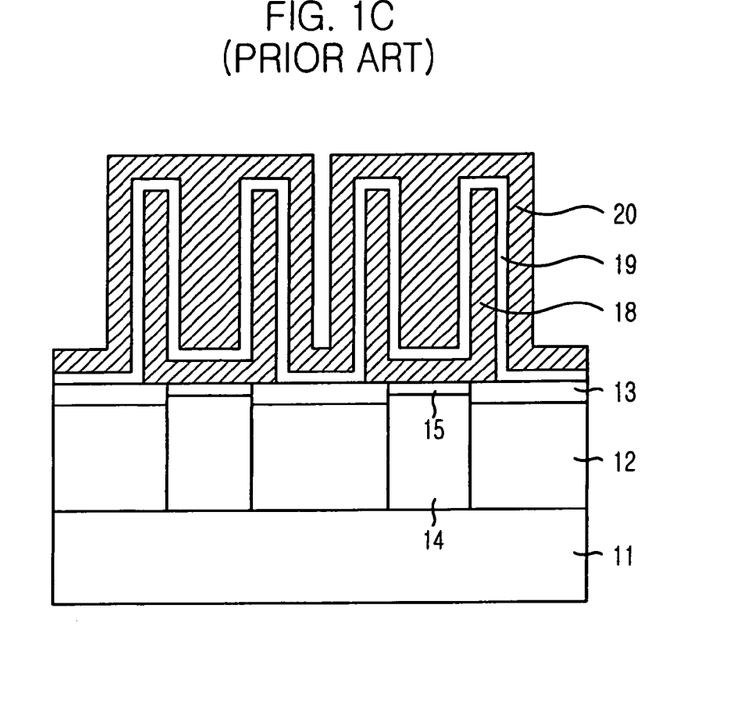

FIGS. 1A to 1C are cross-sectional views illustrating a conventional method for fabricating a semiconductor memory device including a plurality of cylinder type storage nodes.

As shown in FIG. 1A, a first insulation layer 12 and an etch stop layer 13 are sequentially formed on a substrate 11. Afterwards, although not illustrated, a plurality of contact holes penetrating into the etch stop layer 13 and the first insulation layer 12 are formed. Then, a plurality of storage node contact plugs 14 buried into the plurality of contact holes are formed. At this time, in case of that the plurality of storage node contact plugs 14 are formed with a polysilicon layer, a metal silicide layer 15 is formed on each of the plurality of storage node contact plugs 14.

Next, a second insulation layer 16 which determines a height of the storage node is formed on the etch stop layer 13 and on the metal silicide layer 15. Afterwards, the second insulation layer 16 is etched, thereby forming a plurality of storage node holes 17 opening upper portions of the plurality of storage node contact plugs 14.

As shown in FIG. 1B, a plurality of cylinder-type storage nodes 18 are formed along the inner walls of the plurality of storage node holes 17. At this time, the plurality of storage nodes 18 are made of titanium nitride (TiN).

As shown in FIG. 1C, the second insulation layer 16 is selectively subjected to a wet dip-out process and thus, the inner walls and outer walls of the plurality of storage nodes 18 are exposed.

Next, a dielectric layer 19 and a plate electrode 20 are sequentially formed on the plurality of storage nodes 18. At this time, the plate electrode 20 is made of TiN.

The conventional method described above forms the plurality of cylinder-type storage nodes 18 with the exposed inner walls and outer walls. Furthermore, both the plurality of storage nodes 18 and the plate electrode 20 are made of a metal layer such as TiN, and the dielectric layer 19 is formed by using a single layer of $HfO_2$ or stack layers of $Al_2O_3$ and $HfO_2$.

For instance, TiN used for forming the plurality of storage nodes 18 and the plate electrode 20 is deposited through a chemical vapor deposition (CVD) method.

Particularly, when the TiN is deposited through the CVD method for forming the plurality of storage nodes 18, titanium tetrachloride ($TiCl_4$) is used as a source gas to deposit the TiN on the plurality of storage node holes 17 having a high aspect ratio in a conformal structure.

However, the TiN deposited through the CVD method has a property that a grain boundary grows as a main structure and thus, the TiN becomes a material with a very high level of stress. Accordingly, a pinhole or a crack penetrating TiN can easily be generated.

As described above, during selectively performing the wet dip-out process to the second insulation layer 16, the pinhole or the crack becomes a path through which a wet chemical passes, thereby causing a bottom structure to be damaged. As a result, large voids are induced on a bottom portion of the capacitor. The voids are typically called a bunker defect.

Figure 2:
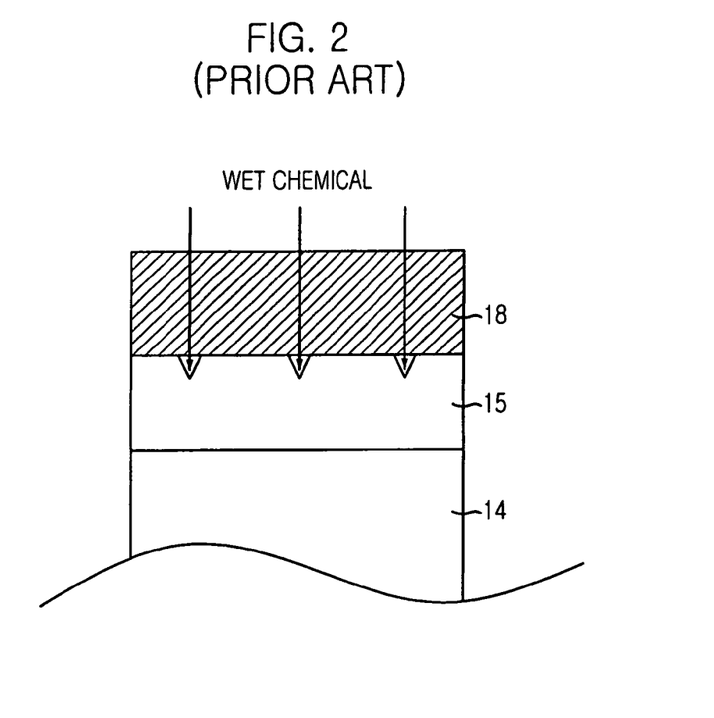
FIG. 2 is a cross-sectional view illustrating a bunker defect appearing when a conventional method is employed.

FIG. 2 is a cross-sectional view illustrating the bunker defect commonly appearing when the conventional capacitor fabrication method is used. Herein, the same reference numerals are used in FIGS. 1A to 1C used for the same configuration elements.

As shown in FIG. 2, the cylinder type storage node 18 made of TiN deposited through the CVD method is formed. Afterwards, the second insulation layer 16 is subjected to the wet dip-out process by using the wet chemical.

However, during using the wet chemical, the wet chemical penetrates into the storage node 18 through the pinhole or the crack on the TiN used as the storage node material. As a result, the wet chemical penetrates into the metal silicide layer 15 and the storage node contact plug 14 placed beneath the storage node 18.

The wet chemical penetrating into the metal silicide layer 15 induces damages on the metal silicide layer 15, thereby generating the bunker defect.

The bunker defect becomes a main reason for degrading yields of the semiconductor devices.

SUMMARY OF THE INVENTION

It is, therefore, an object of the present invention to provide a method for fabricating a semiconductor memory device capable of preventing a bunker defect caused by a pinhole or a crack on a metal layer used as a storage node.

In accordance with one aspect of the present invention, there is a method for fabricating a semiconductor memory device, including the steps of: forming a plurality of storage node plugs on a substrate; forming an insulation layer with a plurality of openings exposing surfaces of the plurality of storage node plugs on the substrate; forming a plurality of cylinder-type storage nodes inside of the plurality of opening in a structure that a different kind of conductive layer is formed between the same kinds of conductive layers; selectively removing the insulation layer; forming a dielectric layer on the plurality of cylinder type storage nodes; and forming a plate electrode on the dielectric layer.

In accordance with another aspect of the present invention, there is provided a method for fabricating a semiconductor memory device, including the steps of: forming a plurality of storage node contact plugs on a substrate; forming an insulation layer with a plurality of openings exposing surfaces of the plurality of storage node contact plugs on the substrate; sequentially forming a first TiN layer and a tungsten layer over the insulation layer; selectively removing the tungsten layer until a height of the tungsten layer is lower than a surface of the insulation layer inside of the plurality of openings; forming a second TiN layer on entire exposed surfaces of the first TiN layer and the tungsten layer; selectively removing the first TiN layer and the second TiN layer disposed on an upper surface of the insulation layer, thereby obtaining a plurality of cylinder-type storage nodes with a structure that the tungsten layer is formed between the first TiN layer and the second TiN layer; selectively removing the insulation layer; and sequentially forming a dielectric layer and a plate electrode on the plurality of cylinder-type storage nodes.

BRIEF DESCRIPTION OF THE DRAWINGS

The above and other objects and features of the present invention will become better understood with respect to the following description of the preferred embodiment given in conjunction with the accompanying drawings, in which.

DETAILED DESCRIPTION OF THE INVENTION

Hereinafter, detailed descriptions on preferred embodiments of the present invention will be provided with reference to the accompanying drawings.

FIGS. 3A to 3H are cross-sectional views illustrating a method for fabricating a semiconductor memory device including a plurality of cylinder-type storage nodes in accordance with the present invention.

Figure 3A:
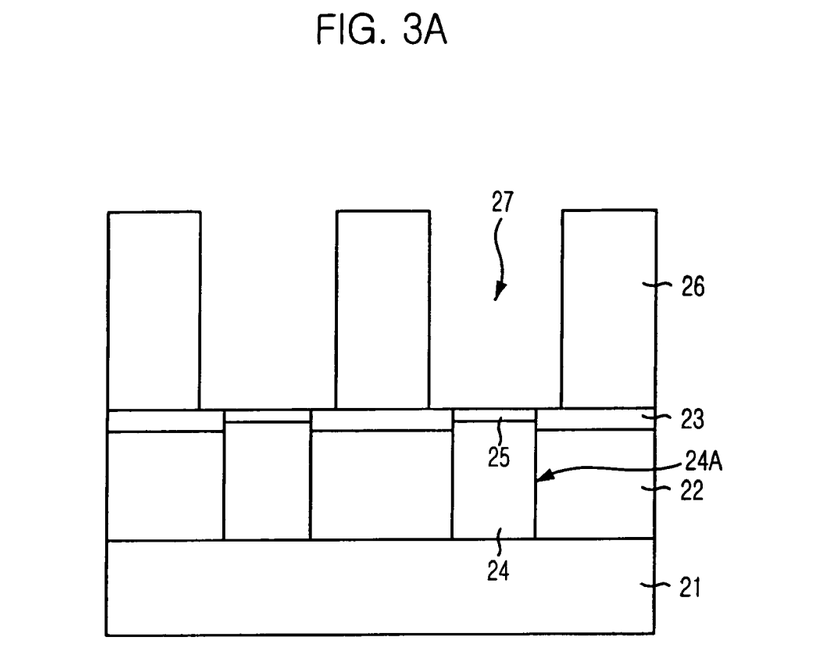
FIGS. 3A to 3H are cross-sectional views illustrating a method for fabricating a semiconductor memory device including a plurality of cylinder-type storage nodes in accordance with the present invention.

As shown in FIG. 3A, a first insulation layer 22 and an etch stop layer 23 are sequentially formed on a substrate 21. Herein, the first insulation layer 22 is formed with a material selected from a group consisting of borophosphosilicate glass (BPSG), undoped silicate glass (USG), plasma-enhanced tetraethylorthosilicate (PETEOS) and high density plasma (HDP) oxide. The etch stop layer 23 includes a silicon nitride ($Si_3N_4$) layer formed through a low pressure chemical vapor deposition (LPCVD) method and has a thickness ranging from approximately 500 Å to approximately 1,500 Å.

Next, a plurality of contact holes 24A penetrating into the etch stop layer 23 and the first insulation layer 22 are formed and then, a plurality of storage node contact plugs 24 buried in the plurality of contact holes 24A are formed. At this time, in case the plurality of storage node contact plugs 24 are formed with a polysilicon layer, a metal silicide layer 25 is formed on each of the plurality of storage node contact plugs 24.

To form the plurality of storage node contact plugs 24, the polysilicon layer is deposited in a thickness ranging from 1,000 Å to 3,000 Å on the etch stop layer 23 until the plurality of contact holes 24A are completely filled. Afterwards, a portion of the polysilicon layer is recessed through an etch-back process or a chemical mechanical polishing (CMP) process. Thereafter, a metal layer is deposited on the recessed polysilicon layer and a rapid thermal process is performed thereon, thereby inducing a silicide reaction between the polysilicon layer and the metal layer. As a result, the metal silicide layer 25 is formed. Herein, titanium silicide ($TiSi_2$) is used for forming the metal silicide layer 25.

Next, a second insulation layer 26 which determines a height of a plurality of storage nodes which will be formed subsequently is formed on the etch stop layer 23 and on the metal silicide layer 25. Afterwards, the second insulation layer 26 is etched, thereby forming a plurality of storage node holes 27 opening upper portions of the plurality of storage node contact plugs 24. Herein, the second insulation layer 26 is made of a material selected from a group consisting of BPSG, USG, PETEOS and HDP oxide.

Figure 3B:
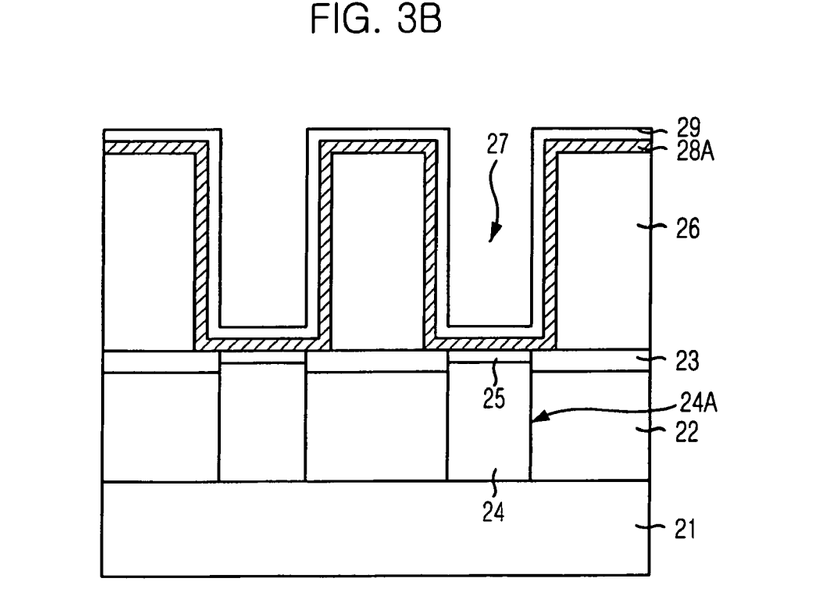

As shown in FIG. 3B, a first TiN layer 28A to be a bottom layer of the plurality of storage nodes is deposited on a surface of the second insulation layer 26 and the opened portions of the plurality of storage node holes 27 in a thickness ranging from approximately 10 Å to approximately 300 Å. At this time, the first TiN layer 28A is deposited through a CVD method or an atomic layer deposition (ALD) method. To form more uniform and less stressed TiN, the ALD method is used.

Next, a tungsten layer 29 to be a middle layer of the plurality of storage nodes is deposited on a surface of the first TiN layer 28A.

The aforementioned tungsten layer 29 is deposited in a thickness ranging from approximately 10 Å to approximately 300 Å through the ALD method. The tungsten layer 29 is deposited through the ALD method in order to strengthen a storage node structure at bottom edges of the plurality of storage node holes 27. That is, through employing the ALD method with a good step-coverage property, the tungsten layer 29 is deposited in a uniform thickness on the bottom and lateral sides of the individual storage node holes 27. Contrary to the ALD method, in case of depositing the tungsten layer 29 is deposited through the CVD method, since the CVD method has a relatively poor step-coverage property compared with the ALD method, there is a possibility that a thickness of the bottom edges of the plurality of storage node holes 27 can be smaller than a thickness of the bottoms and the lateral sides of the plurality of storage node holes 27. If the bottom edges of the plurality of storage node holes 27 are thin, the plurality of storage node holes 27 can be weak with respect to the penetration of a chemical during a subsequent wet dip-out process.

Through the above series of processes, the first TiN layer 28A and the tungsten layer 29 used for forming the plurality of storage nodes construct a dual structure. Particularly, the first TiN layer 28A and the tungsten layer 29 are deposited through the ALD method, thereby strengthening the bottom edge of the storage node structure.

Figure 3C:
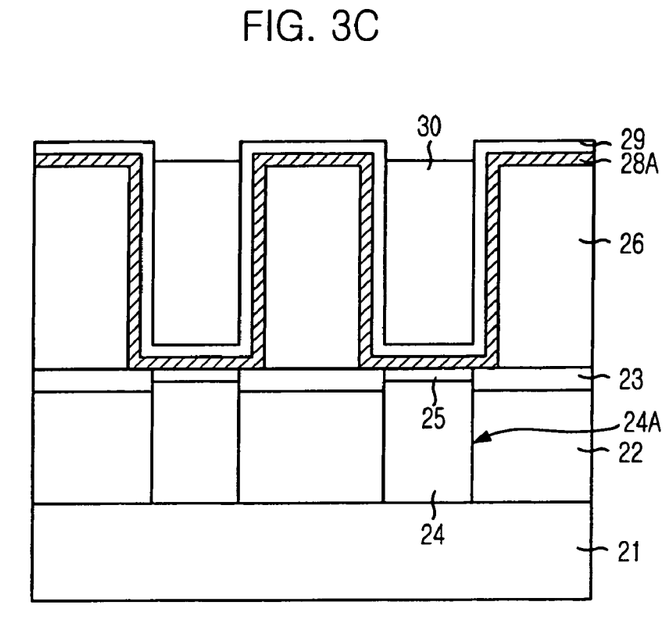

As shown in FIG. 3C, a passivation layer 30 is deposited on the tungsten layer 29 until the plurality of storage node holes 27 are completely filled into the storage nodes 27 shown in FIG. 3B. Then, the passivation layer 30 remains inside of the plurality of storage node holes 27 through an etch-back process.

At this time, the passivation layer 30 serves a role in preventing the tungsten layer 29 inside of the plurality of storage node holes 27 from being damaged during a subsequent blanket etch-back process. The passivation layer 30 is formed by using a photoresist or oxide layer having a certain selectivity value with respect to the tungsten layer 29 during the blanket etch-back process.

Figure 3D:
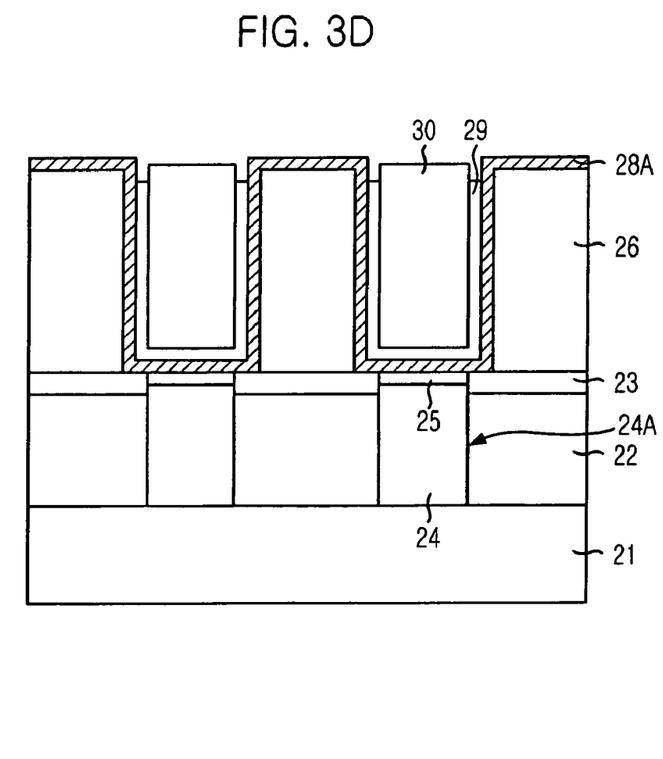

As shown in FIG. 3D, the blanket etch-back process is performed to the tungsten layer 29 under the state that the passivation layer 30 remains. At this time, the blanket etch-back process is performed by using a fluorine-based gas such as tetrafluoromethane ($CF_4$) or hexafluoroethane ($C_2F_6$). The blanket etch-back process prevents the first TiN layer 28A from being damaged and selectively etches the tungsten layer 29 exposed on an upper portion of the second insulation layer 26.

During the above blanket etch-back process, the tungsten layer 29 is controlled to maintain at least a bottom structure of the tungsten layer 29 as being initially deposited at the bottom edges of the plurality of storage node holes 27. Accordingly, some portions of the tungsten layer 29 disposed on upper lateral sides of the plurality of storage node holes 27 are removed. Thus, the tungsten layer 29 has a height lower than a surface of the second insulation layer 26. The height of the tungsten layer 29 lower than the second insulation layer 26 means a sufficient margin of the etch-back process performed to the tungsten layer 29.

During the blanket etch-back process, if the fluorine-based gas is used, it is possible to prevent the first TiN layer 28A placed beneath the tungsten layer 29 from being damaged and to selectively etch the tungsten layer 29.

Figure 3E:
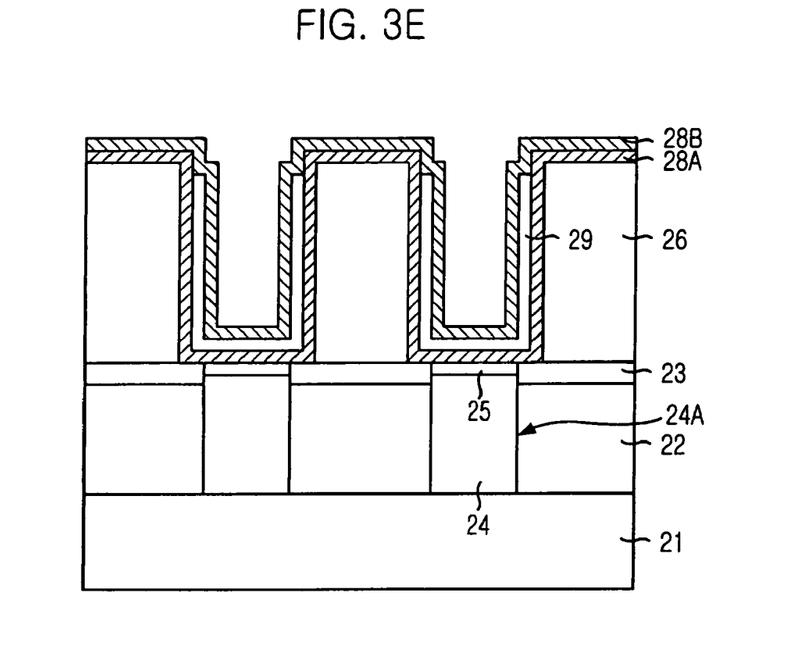

As shown in FIG. 3E, the passivation layer 30 is removed. After the removal of the passivation layer 30, the tungsten layer 29 remains only inside of the plurality of storage node holes 27 through the blanket etch-back process and the first TiN layer 28A is still maintained with the originally deposited structure.

Next, a second TiN layer 28B is deposited on the first TiN layer 28A and the tungsten layer 29. At this time, the second TiN layer 28B is a material to become a top layer of the plurality of storage nodes. The second TiN layer 28B is deposited in a thickness ranging from approximately 10 Å to approximately 300 Å through the ALD method used for depositing the first TiN layer 28A.

By forming the second TiN layer 28B, a metal layer structure supposed to become the plurality of storage nodes has a structure of TiN/W/TiN. As the structure of TiN/W/TiN shows, the storage node structure includes different metal layers.

Figure 3F:
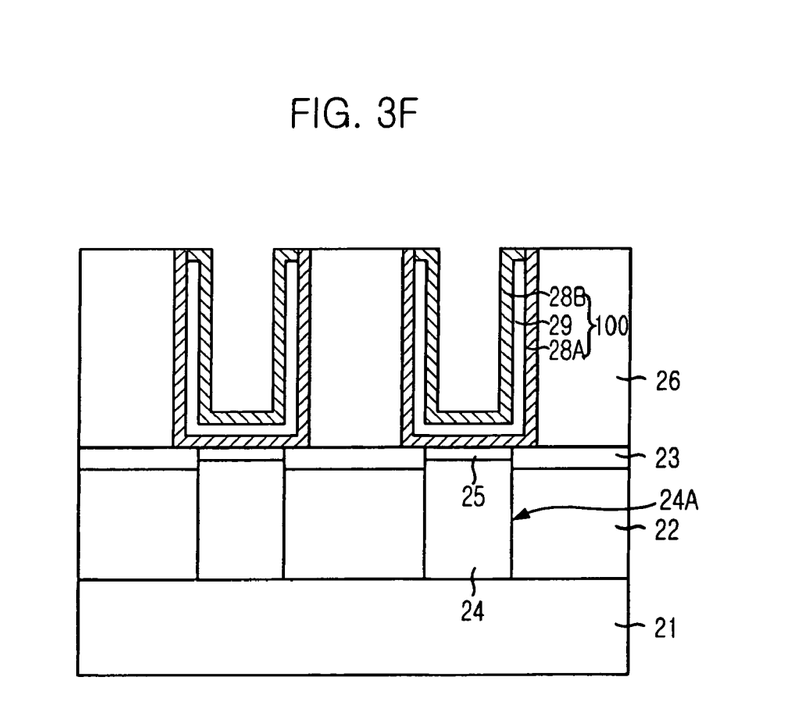

As shown in FIG. 3F, a storage node isolation process forming a plurality of cylinder-type storage nodes 100 only inside of the plurality of storage node holes 27 is employed.

The storage node isolation process removes the first TiN layer 28A and the second TiN layer 28B formed on the upper portion of the second insulation layer 26 through a CMP process or an etch-back process, thereby forming the plurality of cylinder-type storage nodes 100. Herein, when the first TiN layer 28A and the second TiN layer 28B are removed, there is a possibility that impurities such as abrasive and etched particles are stuck to the inner walls of the plurality of cylinder-type storage nodes 100. Thus, although not illustrated, the inside of the plurality of storage node holes 27 are completely filled with a photoresist layer with a good step-coverage property, and a polishing process or an etch-back process is subsequently employed until the second insulation layer 26 is exposed. Thereafter, the photoresist layer is removed by ashing.

The tungsten layer 29 is compelled not to be exposed during performing the storage node isolation process. The tungsten layer 29 is easily oxidized during a subsequent thermal process and has a very weak oxidation resistance property. Thus, it is required to avoid the tungsten layer 29 from being exposed. For this reason, the blanket etch-back process shown in FIG. 3D should be performed for a sufficient time to cause a height of the tungsten layer 29 to be lower than that of the individual storage node holes 27. Accordingly, during the storage node isolation process, the tungsten layer 29 is not etched.

The plurality of storage nodes 100 formed through the storage node isolation process are cylinder types that the tungsten layer 29 exists between the first TiN layer 28A and the second TiN layer 28B.

Figure 3G:
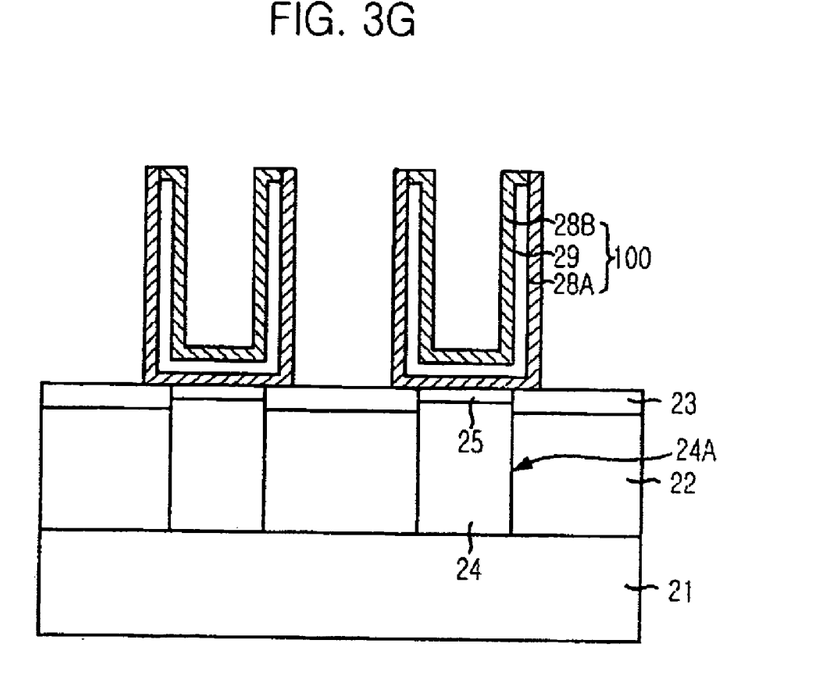

As shown in FIG. 3G, the second insulation layer 26 is subjected to a wet dip-out process, thereby exposing both inner walls and outer walls of the plurality of storage nodes 100.

At this time, the wet dip-out process is employed by using a hydrogen fluoride (HF) solution. The oxide-based second insulation layer 26 is etched by using the HF solution. Meanwhile, the etch stop layer 23 beneath the second insulation layer 26 is formed by using silicon nitride having selectivity with respect to oxide during performing the wet etching process and thus, the etch stop layer 23 is not etched by the wet chemical.

During the aforementioned wet chemical dip-out process, the HF solution penetrates into the plurality of storage nodes 100 and thus, also penetrates into the metal silicide layer 25 and the plurality of storage node contact plugs 24. However, the plurality of storage nodes 100 has a structure including the tungsten layer 29 that is a material different from the TiN layer between the first TiN layer 28A and the second TiN layer 28B. Thus, the HF solution cannot penetrate into the plurality of storage nodes 100 due to the tungsten layer 29.

That is, although the HF solution penetrates into the second TiN layer 28B because the pinhole or the crack is generated on the second TiN layer 28B, the tungsten layer 29 that is the material different from the second TiN layer 28B blocks the HF solution from penetrating into the first TiN layer 28A.

Furthermore, the tungsten layer 29 is a metal layer that does not suffer from damages caused by an oxide etch solution such as the HF solution. Thus, the HF solution is much more blocked from penetrating into the plurality of storage nodes 100.

Figure 3H:
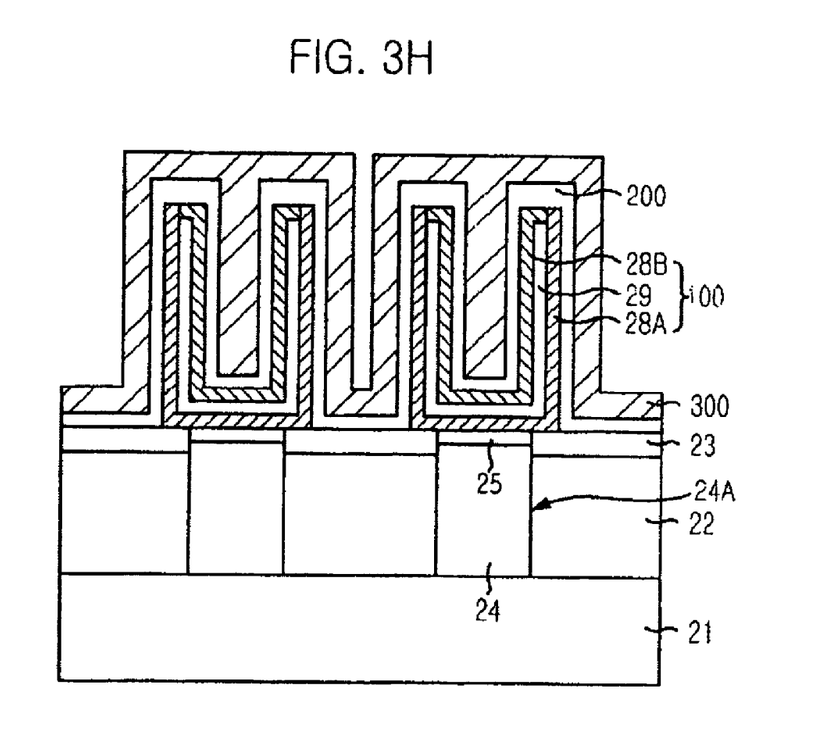

As shown in FIG. 3H, a dielectric layer 200 and a plate electrode 300 are sequentially formed on the plurality of storage nodes 100. At this time, the dielectric layer 200 is formed in a single layer of $HfO_2$ or in a stack structure of $Al_2O_3$ and $HfO_2$. The plate electrode 300 is made of a material selected from a group consisting of TiN, tungsten (W) and ruthenium (Ru).

Although the preferred embodiment of the present invention teaches that the plurality of storage nodes are formed in the structure of TiN/W/TiN, a metal layer selected from a group consisting of tantalum (Ta), tantalum nitride (TaN) and tungsten nitride (WN) and a polysilicon layer can be used as the middle layer placed between the first TiN layer and the second TiN layer in addition to the tungsten layer. The polysilicon layer is used as an electrode material of a capacitor and prevents the wet chemical from penetrating into TiN since the polysilicon layer is a material different from TiN.

In addition to the structure of TiN/W/TiN, the present invention is not limited to use TiN to form the storage node structure. Instead, the present invention can be applied to a capacitor forming a plurality of storage nodes by using different kinds of metal layers or a conductive layer in order to block a wet chemical from penetrating into the metal layer in various kinds of cylinder-type capacitors using the single metal layer.

In accordance with the present invention, a storage node is formed by using two different kinds of materials. Accordingly, a wet chemical is blocked from penetrating into a bottom structure of a capacitor through a conductive layer used as the storage node, thereby providing an effect of improving yields of semiconductor memory devices with excellent reliability.

The present application contains subject matter related to the Korean patent application No. KR 2004-0060276, filed in the Korean Patent Office on Jul. 30, 2004 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor memory device, comprising:
   forming a plurality of storage node plugs on a substrate;
   forming an insulation layer with a plurality of openings exposing surfaces of the plurality of storage node plugs on the substrate;
   forming a plurality of cylinder-type storage nodes inside the plurality of openings, wherein each of the cylinder type storage nodes includes a bottom layer, a middle layer, and a top layer;
   selectively removing the insulation layer;
   forming a dielectric layer on the plurality of cylinder type storage nodes; and
   forming a plate electrode on the dielectric layer,
   wherein forming the plurality of cylinder type storage nodes includes:
      forming the middle layer on the bottom layer using a material different from a material used for forming the bottom layer;
      forming a passivation layer filling the plurality of openings over the middle layer;
      selectively removing the passivation layer such that the passivation layer remains only inside the plurality of openings;
      performing a blanket etch-back process to remove a portion of the middle layer until a height of the middle layer is lower than that of the remaining passivation layer; and
      removing the remaining passivation layer.

2. The method of claim 1, wherein the step of forming the plurality of cylinder type storage nodes further includes:
   forming the bottom layer on the insulation layer and the plurality of openings;
   forming the top layer on entire exposed surfaces of the middle layer and the bottom layer, using the same material as used for forming the bottom layer; and
   selectively removing the bottom layer and the top layer disposed on an upper surface of the insulation layer, thereby obtaining the plurality of storage nodes with a structure that the middle layer is formed between the bottom layer and the top layer.

3. The method of claim 2, wherein the bottom layer, the middle layer and the top layer are formed through an atomic layer deposition (ALD) method.

4. The method of claim 2, wherein the bottom layer and the top layer include the same metal and the middle layer includes a metal different from the metal used for forming the bottom layer and the top layer.

5. The method of claim 4, wherein the bottom layer and the top layer include TiN and the middle layer includes a metal selected from a group consisting of tungsten (W), tantalum (Ta), tantalum nitride (TaN) and tungsten nitride (WN).

6. The method of claim 2, wherein the bottom layer and the top layer include TIN and the middle layer includes a polysilicon layer.

7. The method of claim 1, wherein the passivation layer is formed by using one of a photoresist layer and an oxide layer.

8. A method for fabricating a semiconductor memory device, comprising the steps of:
   forming a plurality of storage node contact plugs on a substrate;
   forming an insulation layer with a plurality of openings exposing surfaces of the plurality of storage node contact plugs on the substrate;
   sequentially forming a first TiN layer and a tungsten layer over the insulation layer;
   selectively removing the tungsten layer until a height of the tungsten layer is lower than a surface of the insulation layer inside of the plurality of openings;
   forming a second TiN layer on entire exposed surfaces of the first TiN layer and the tungsten layer;
   selectively removing the first TiN layer and the second TiN layer disposed on an upper surface of the insulation layer, thereby obtaining a plurality of cylinder-type storage nodes with a structure that the tungsten layer is formed between the first TiN layer and the second TiN layer;
   selectively removing the insulation layer; and
   sequentially forming a dielectric layer and a plate electrode on the plurality of cylinder-type storage nodes.

9. The method of claim 8, wherein the first TiN layer, the tungsten layer and the second TiN layer are formed through an atomic layer deposition (ALD) method.

10. The method of claim 9, wherein each of the first TIN layer, the tungsten layer and the second TiN layer are formed in a thickness ranging from approximately 10 Å to approximately 300 Å.

11. The method of claim 8, wherein the step of selectively removing the tungsten layer includes the steps of:
    forming a passivation layer filling the plurality of openings;
    selectively removing the passivation layer such that the passivation layer remains only inside the plurality of openings;
    performing a blanket etch-back process to remove a portion of the tungsten layer until a height of the tungsten layer is lower than that of the passivation layer; and
    removing the passivation layer.

12. The method of claim 11, wherein the passivation layer is formed by using one of a photoresist layer and an oxide layer.

13. The method of claim 11, wherein the blanket etch-back process is performed by using a fluorine-based gas selected from tetrafluoromethane ($CF_4$) and hexafluoroethane ($C_2F_6$).

14. A method for fabricating a semiconductor memory device, comprising:
    forming an insulation layer with a plurality of openings exposing surfaces of a plurality of storage node plugs formed on a substrate;
    forming a plurality of cylinder type storage nodes inside the plurality of openings;
    selectively removing the insulation layer; and
    forming a dielectric layer and a plate electrode on the plurality of cylinder type storage nodes;
    wherein forming the plurality of cylinder type storage nodes includes:
       forming a bottom layer and a middle layer over the insulation layer having the plurality of openings;
       forming a passivation layer filling the plurality of openings over the middle layer;
       selectively removing the passivation layer such that the passivation layer remains only inside the plurality of openings;

performing a blanket etch-back process to remove a portion of the middle layer until a height of the middle layer is lower than that of the remaining passivation layer;

removing the remaining passivation layer;

forming a top layer on entire exposed surfaces of the middle layer and the bottom layer; and selectively removing the bottom layer and the top layer disposed on an upper surface of the insulation layer.

15. The method of claim 14, wherein the bottom layer, the middle layer, and the top layer are formed through an atomic layer deposition (ALD) method.

16. The method of claim 14, wherein the passivation layer is formed by using one of a photoresist layer and an oxide layer.

17. The method of claim 14, wherein the bottom layer and the top layer comprise TiN and the middle layer comprises a metal selected from the group consisting of tungsten (W), tantalum (Ta), tantalum nitride (TaN), and tungsten nitride (WN).

18. The method of claim 14, wherein the bottom layer and the top layer comprise TiN and the middle layer comprises a polysilicon layer.

* * * * *